(12) United States Patent
Jin et al.

(10) Patent No.: US 12,227,844 B2
(45) Date of Patent: Feb. 18, 2025

(54) CHEMICAL VAPOR DEPOSITION DEVICE CAPABLE OF RECIPROCATING ROTATION AND LIFTING

(71) Applicant: Betone Technology Shanghai, Inc., Shanghai (CN)

(72) Inventors: Xiaoliang Jin, Shanghai (CN); Xueqin Pan, Shanghai (CN); Weicong Song, Shanghai (CN)

(73) Assignee: Betone Technology Shanghai, Inc., Shanghai (CN)

( * ) Notice: Subject to any disclaimer, the term of this patent is extended or adjusted under 35 U.S.C. 154(b) by 0 days.

(21) Appl. No.: 18/699,311

(22) PCT Filed: Sep. 22, 2022

(86) PCT No.: PCT/CN2022/120432
§ 371 (c)(1),
(2) Date: Apr. 8, 2024

(87) PCT Pub. No.: WO2023/082853
PCT Pub. Date: May 19, 2023

(65) Prior Publication Data
US 2024/0327986 A1    Oct. 3, 2024

(30) Foreign Application Priority Data
Nov. 11, 2021   (CN) .......................... 202111330342.6

(51) Int. Cl.
*C23C 16/458*   (2006.01)
(52) U.S. Cl.
CPC ...... *C23C 16/4584* (2013.01); *C23C 16/4586* (2013.01)

(58) Field of Classification Search
CPC ........................ C23C 16/4584; C23C 16/4586
(Continued)

(56) References Cited

U.S. PATENT DOCUMENTS

| 6,120,609 A | * | 9/2000 | Selyutin | ............ | H01L 21/68792 |
| | | | | | 118/500 |
| 2004/0177813 A1 | | 9/2004 | Schieve et al. | | |

(Continued)

FOREIGN PATENT DOCUMENTS

| CN | 102160166 Y | 8/2011 |
| CN | 111364026 | 7/2020 |

(Continued)

*Primary Examiner* — Charlee J. C. Bennett
(74) *Attorney, Agent, or Firm* — IPRTOP LLC

(57) ABSTRACT

A chemical vapor deposition device capable of reciprocating rotation and lifting is provided. The chemical vapor deposition device includes a cavity, a base, a fixing bracket, a lifting mechanism, and a rotation mechanism. The present disclosure utilizes the principle of magnetic-fluid sealing to achieve device sealing and integrates the rotation and lifting functions, satisfying the coordinated work of reciprocating rotation, lifting movement, wafer heating, etc. at the same time without affecting each other. Moreover, the problem of physical entanglement and damage of electrical wires during the rotation process has been avoided, and micro-particles formed in the cavity will not affect the rotation mechanism, thereby enabling the efficient and stable operation of the rotation mechanism. The present disclosure has fewer transmission components, which reduces instability and mechanical wear caused by redundant components, improves the accuracy and stability of lifting and rotation control, and minimizes manufacturing costs and power consumption.

7 Claims, 7 Drawing Sheets

(58) Field of Classification Search
USPC .......................................................... 118/730
See application file for complete search history.

(56) References Cited

U.S. PATENT DOCUMENTS

| | | | | |
|---|---|---|---|---|
| 2006/0281310 | A1* | 12/2006 | Smith ................. | C23C 16/4584 |
| | | | | 438/680 |
| 2010/0055918 | A1* | 3/2010 | Nakada ............... | C23C 16/4401 |
| | | | | 438/758 |
| 2010/0294199 | A1* | 11/2010 | Tran .................. | H01L 21/68785 |
| | | | | 118/723 R |
| 2011/0305544 | A1* | 12/2011 | Chen .................. | C23C 16/4583 |
| | | | | 219/520 |
| 2014/0263275 | A1* | 9/2014 | Nguyen ................. | G01K 13/08 |
| | | | | 374/179 |
| 2015/0236566 | A1* | 8/2015 | Yudovsky ............. | C23C 16/458 |
| | | | | 310/67 R |
| 2019/0006209 | A1* | 1/2019 | Wieser .................... | F25B 21/02 |
| 2019/0390337 | A1* | 12/2019 | Mustafa .............. | C23C 16/4586 |
| 2020/0016755 | A1* | 1/2020 | Harada .................... | B25J 9/104 |
| 2020/0381272 | A1* | 12/2020 | Orimoto ........... | H01L 21/67126 |

FOREIGN PATENT DOCUMENTS

| | | |
|---|---|---|
| CN | 111364026 Y | 7/2020 |
| CN | 111534809 A | 8/2020 |
| CN | 111705302 A | 9/2020 |
| CN | 211946124 A | 11/2020 |
| CN | 212335281 A | 1/2021 |
| CN | 213142184 A | 5/2021 |
| CN | 113774360 | 12/2021 |

* cited by examiner

CHEMICAL VAPOR DEPOSITION DEVICE CAPABLE OF RECIPROCATING ROTATION AND LIFTING

FIELD OF THE INVENTION

The present disclosure belongs to the field of semiconductor high-end manufacturing devices, and relates to an optimized chemical vapor deposition device capable of reciprocating rotation and lifting.

BACKGROUND OF THE INVENTION

The vacuum degree and film deposition uniformity inside the reaction chamber are critical for chemical vapor deposition (CVD) devices. While there are design schemes that independently utilize rotation devices and independently employ lifting devices to improve film uniformity, these schemes are not the best option for CVD devices considering manufacturing cost, power consumption, and operational stability. The main reasons are as follows: (1) CVD devices require a certain degree of vacuum tightness, but the requirements are not as high as those for physical vapor deposition (PVD), as dictated by the pressure inside the chamber, so the design schemes suitable for PVD are more complex and expensive, and have high power consumption; (2) CVD devices need to solve problems such as rotation, lifting, winding of electrical wires, and electromagnetic interference at the same time; (3) there are too many transmission components in the existing design schemes of CVD devices, resulting in undesirable stability.

SUMMARY OF THE INVENTION

In view of the above-mentioned disadvantages of the related technology, the present disclosure provides a chemical vapor deposition device capable of reciprocating rotation and lifting for solving problems in the related technology.

The chemical vapor deposition device capable of reciprocating rotation and lifting includes:
  a cavity, provided with a through hole on a bottom of the cavity;
  a base, including a base station and a base shaft, wherein the base station is located in the cavity, the base shaft is located below the base station and fixedly connected with the base station, and a bottom end of the base shaft passes through the through hole to extend out of the cavity;
  a fixing bracket, located below the cavity and fixedly connected with the bottom of the cavity;
  a lifting mechanism, located below the cavity and connected with the fixing bracket, wherein the lifting mechanism includes a lifting bracket; and
  a rotation mechanism, configured to be located below the cavity and include a stator, a rotor, a driven piece, a connector, a magnetic-liquid sealing member, a magnetic liquid and a telescopic tubular assembly; wherein the stator is fixedly connected with the lifting bracket and sleeved on a periphery of the rotor to drive the rotor to rotate with the base shaft as a rotation axis; wherein the driven piece is located above the rotor and fixedly connected with the rotor, and the driven piece is sleeved on a periphery of the base shaft and fixedly connected with the base shaft; wherein the telescopic tubular assembly is located above the driven piece and sleeved on the periphery of the base shaft, a top of the telescopic tubular assembly is hermetically connected with the bottom of the cavity, and a bottom of the telescopic tubular assembly is hermetically connected with a top of the connector; wherein the magnetic-liquid sealing member is sleeved on a periphery of the driven piece and forms a magnetic-liquid containing space with an outer-side wall of the driven piece; wherein the magnetic liquid is located in the magnetic-liquid containing space, a top of the magnetic-liquid sealing member is hermetically connected with a bottom of the connector, and a bottom of the magnetic-liquid sealing member is hermetically connected with a top of the lifting bracket.

Optionally, the lifting mechanism further includes a driving motor, a reducer, a threaded rod and a threaded block. The driving motor, the reducer and the threaded rod are sequentially connected from bottom to top. The reducer is fixedly connected with the fixing bracket, the threaded rod is driven by the reducer to rotate, and the threaded block is sleeved on a periphery of the threaded rod and is configured to move up or down along with the rotation of the threaded rod. A side surface of the fixing bracket is provided with a guide-rail groove, a first side of the threaded block is embedded into the guide-rail groove, and a second side of the threaded block is fixedly connected with the lifting bracket to drive the lifting bracket to move up or down.

Optionally, the fixing bracket includes a supporting portion and a guide-rail block. A top end of the supporting portion is fixedly connected with the bottom of the cavity, and the guide-rail block is located at a side surface of the supporting portion and fixedly connected with the supporting portion. A top end of the reducer is fixedly connected with a bottom end of the guide-rail block, and the guide-rail groove is open from a side of the guide-rail block away from the supporting portion.

Optionally, the telescopic tubular assembly includes a first fixing member, a corrugated pipe and a second fixing member. A top end of the corrugated pipe is fixedly connected with the first fixing member, a bottom end of the corrugated pipe is fixedly connected with the second fixing member, and the first fixing member is hermetically connected with the bottom of the cavity.

Optionally, the rotation mechanism further includes a blowing device, an outer-side surface of the connector is provided with an air inlet connected with the blowing device, an annular air channel communicating with the air inlet is embedded in the connector, and a plurality of air outlets is formed in a bottom of the annular air channel. A vertical distance between the air outlets and the base shaft is smaller than a vertical distance between the outer-side wall of the driven piece and the base shaft.

Optionally, the bottom of the connector is provided with a sliding groove, and a top end of the driven piece extends into the sliding groove and is slidably connected with the connector.

Optionally, the rotation mechanism further includes a filter and an opening sealing member. A top end of the filter extends into the rotor, a top of the opening sealing member is connected with a top of the rotor and covers a top opening of the rotor, and a bottom of the opening sealing member is connected with a top of the filter and covers a top opening of the filter. The opening sealing member is provided with an electrical wire hole allowing at least one electrical wire to pass through, a first end of the electrical wire is connected with the base station, and a second end of the electrical wire passes through the electrical wire hole and extends to the outside through the filter.

Optionally, the stator includes a core and a coil, and the coil is located between the core and the rotor.

Optionally, the chemical vapor deposition device further includes one or more auxiliary brackets, and each auxiliary bracket includes a supporting rod, a sliding shaft and a sliding member. A top end of the supporting rod is fixedly connected with the bottom of the cavity, the supporting rod includes a first extending side wing and a second extending side wing which are arranged at intervals from bottom to top, a bottom end of the sliding shaft is fixedly connected with the first extending side wing, and a top end of the sliding shaft is fixedly connected with the second extending side wing. The sliding member is connected with the lifting bracket and sleeved on a periphery of the sliding shaft and is configured to move up or down along the sliding shaft.

Optionally, the lifting bracket is provided with at least one perforation allowing the sliding shaft to pass through.

As described above, the present disclosure utilizes the principle of magnetic-fluid sealing to achieve device sealing and integrates the rotation and lifting functions. It can satisfy the coordinated work of reciprocating rotation, lifting movement, wafer heating, etc. at the same time without affecting each other. Moreover, by reciprocating rotation, it is also possible to avoid the problem of physical entanglement and damage of electrical wires during the rotation process. In addition, one blowing device can be set in the rotation mechanism to avoid the influence of micro-particles formed in the cavity on the rotation mechanism (or magnetic liquid), enabling the efficient and stable operation of the rotation mechanism. Compared to existing devices, the overall structure of the chemical vapor deposition device of the present disclosure has fewer transmission components, which reduces instability and mechanical wear caused by redundant components. This improves the accuracy and stability of lifting and rotation control, while also lowering manufacturing costs and power consumption.

REFERENCE NUMERALS

Figure 1:
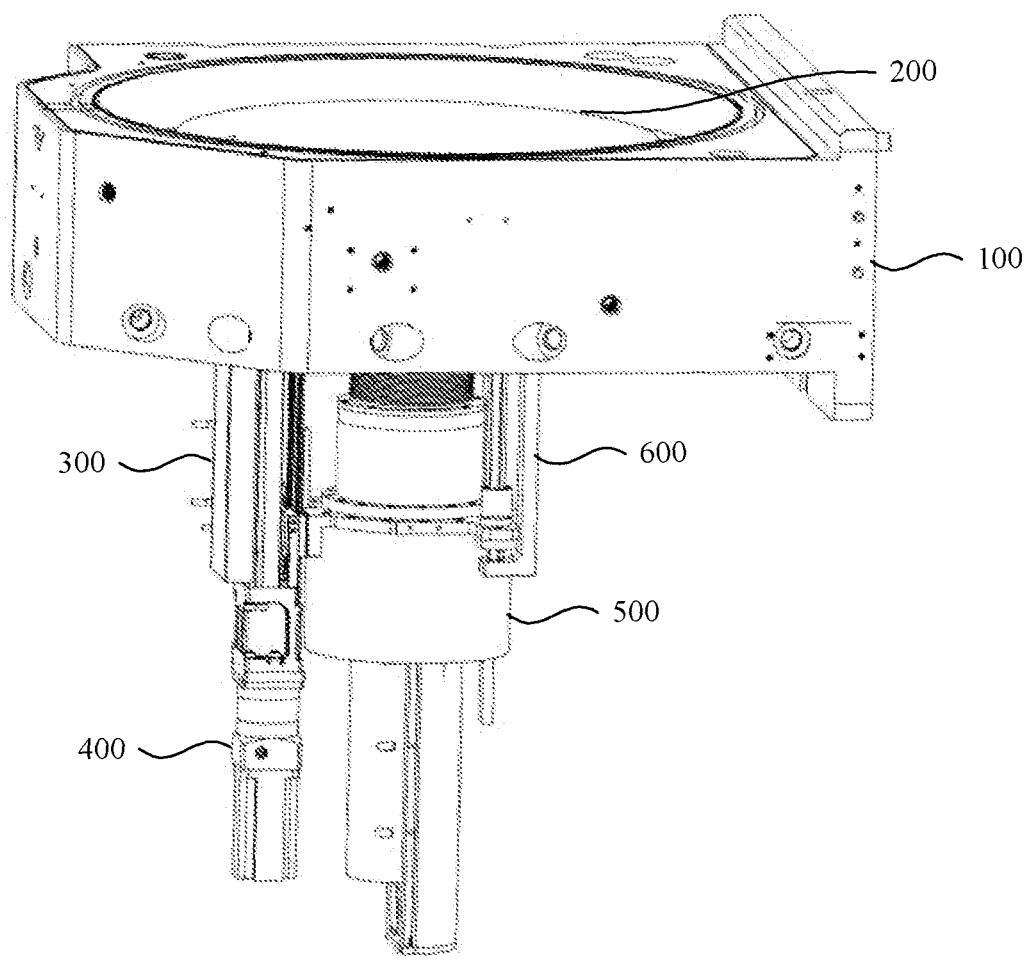
FIG. 1 shows a schematic perspective view of a chemical vapor deposition device capable of reciprocating rotation and lifting according to the present disclosure.

100 Cavity; 101 Through hole; 200 Base; 201 Base station; 202 Base shaft; 300 Fixing bracket; 301 Guide-rail groove; 302 Supporting portion; 303 Guide-rail block; 400 Lifting mechanism; 401 Lifting bracket; 401*a* Perforations; 402 Driving motor; 403 Reducer; 404 Threaded rod; 405 Threaded block; 500 Rotation mechanism; 501 Stator; 501*a* Core; 501*b* Coil; 502 Rotor; 503 Driven piece; 504 Connector; 505 Magnetic-liquid sealing member; 506 Magnetic liquid; 507 Telescopic tubular assembly; 507*a* First fixing member; 507*b* Corrugated pipe; 507*c* Second fixing member; 508 Blowing device; 509 Air inlet; 510 Annular air channel; 511 Air outlet; 512 Filter; 513 Opening sealing member; 600 Auxiliary bracket; 601 Supporting rod; 601*a* First extending side wing; 601*b* Second extending side wing; 602 Sliding shaft; 603 Sliding member.

DETAILED DESCRIPTION OF THE INVENTION

The embodiments of the present disclosure will be described below. Those skilled can easily understand disclosure advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

Refer to FIGS. 1-9. It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during actual implementation thereof may be freely changed, and the component layout configuration thereof may be more complex.

The present disclosure provides a chemical vapor deposition device capable of reciprocating rotation and lifting. Please refer to FIGS. 1 and 2, which show a schematic perspective view and a schematic cross-sectional view of the chemical vapor deposition device, respectively. The chemical vapor deposition device includes a cavity 100, a base 200, a fixing bracket 300, a lifting mechanism 400, and a rotation mechanism 500.

Figure 3:
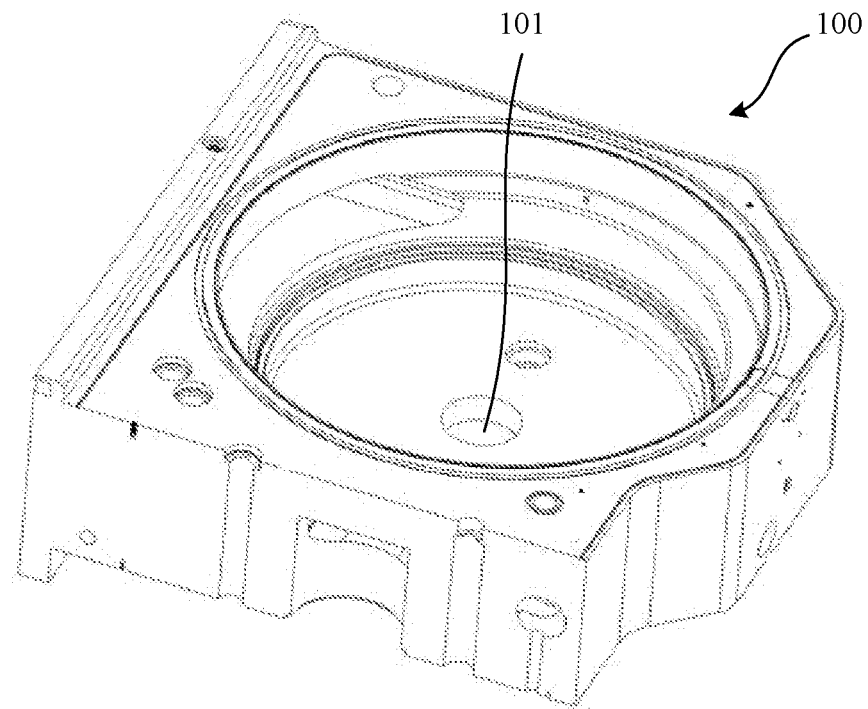
FIG. 3 shows a schematic perspective view of a cavity of the chemical vapor deposition device according to the present disclosure.

Specifically, please refer to FIG. 3, which shows a schematic perspective view of the cavity 100. A through hole 101 is disposed at a bottom of the cavity 100.

Figure 4:
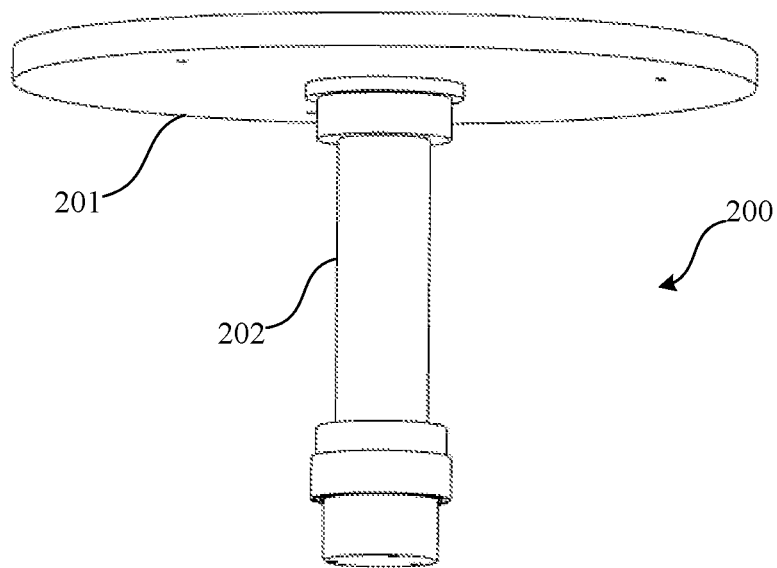
FIG. 4 shows a schematic perspective view of a base of the chemical vapor deposition device according to the present disclosure.

Specifically, please refer to FIG. 4, which shows a schematic perspective view of the base 200. The base 200 includes a base station 201 and a base shaft 202. The base station 201 is located in the cavity 100, the base shaft 202 is located below the base station 201 and fixedly connected with the base station 201, and a bottom end of the base shaft 202 passes through the through hole 101 to extend out of the cavity 100.

As an example, the base shaft 202 is fixedly connected with a center position of a lower surface of the base station 201. The base station 201 includes a heating member (not shown), the interior of the base shaft 202 is hollow and allows an electrical wire connected with the heating member to pass through, and the electrical wire is configured to supply power to the base station 201 and other related devices.

Figure 2:
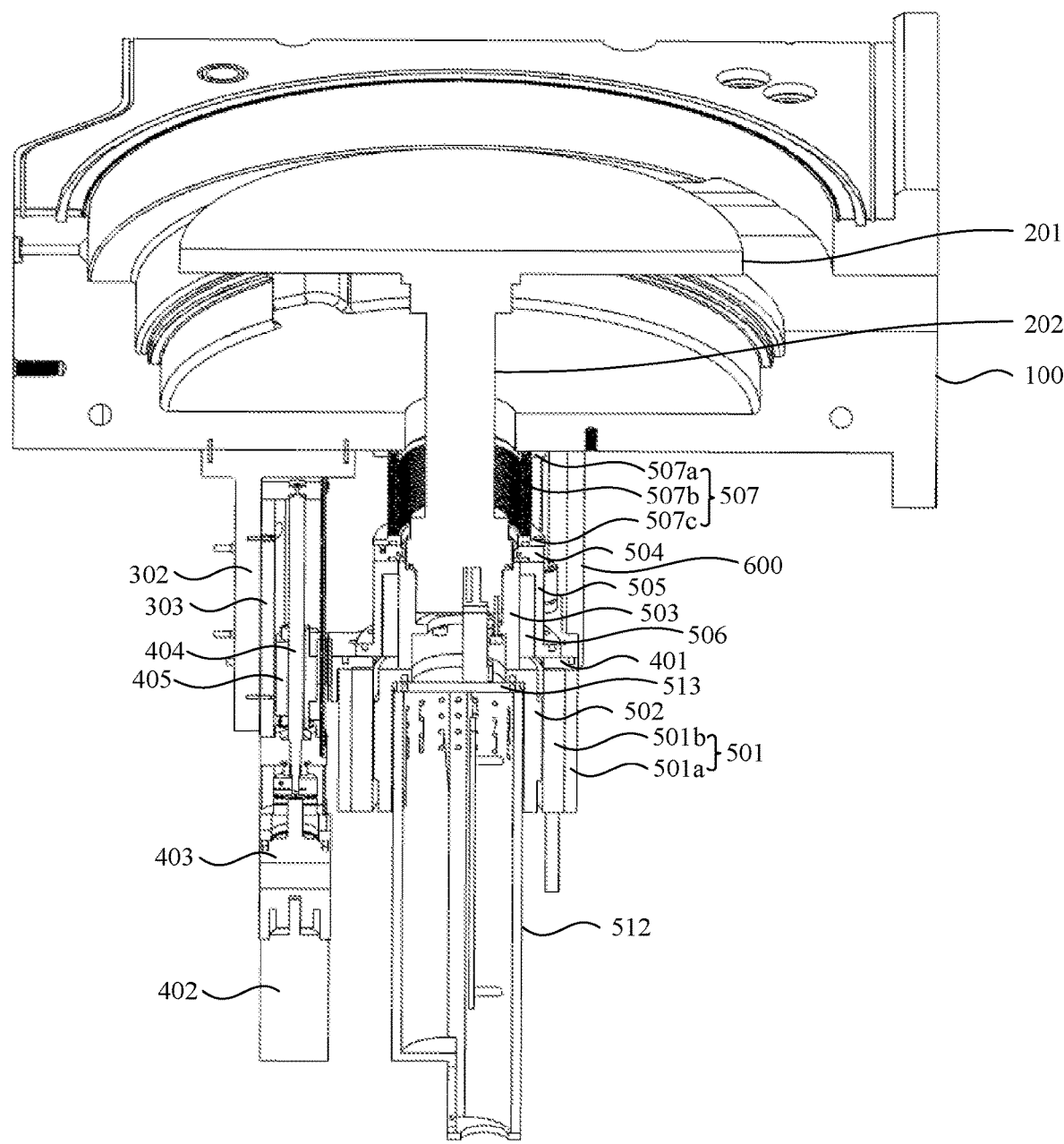
FIG. 2 shows a schematic cross-sectional view of the chemical vapor deposition device capable of reciprocating rotation and lifting according to the present disclosure.

Specifically, as shown in FIGS. 1 and 2, the fixing bracket 300 is located below the cavity 100 and fixedly connected with a bottom of the cavity 100.

Figure 5:
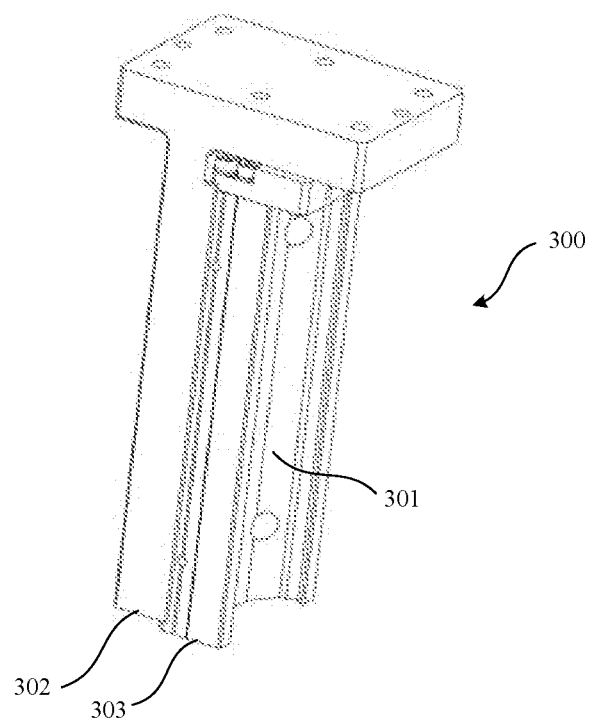
FIG. 5 shows a schematic perspective view of a fixing bracket of the chemical vapor deposition device according to the present disclosure.
Figure 6:
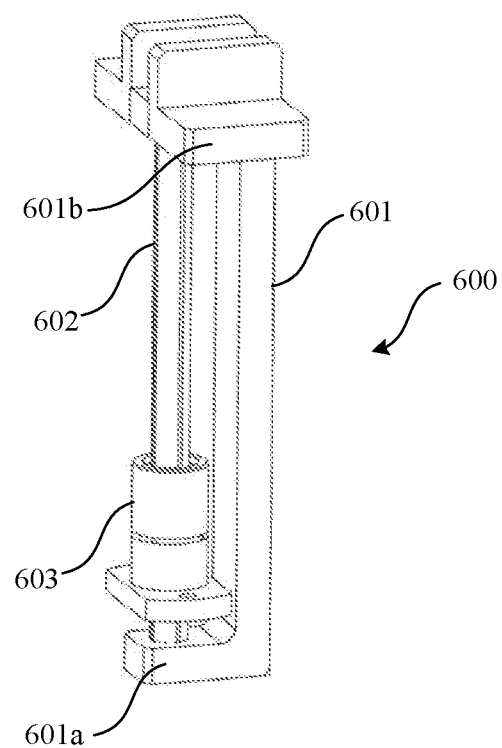
FIG. 6 shows a schematic perspective view of an auxiliary bracket of the chemical vapor deposition device according to the present disclosure.

As an example, please refer to FIG. 5, which shows a schematic perspective view of the fixing bracket 300. The fixing bracket 300 includes a supporting portion 302 and a guide-rail block 303. A top end of the supporting portion 302 is fixedly connected with the bottom of the cavity 100, and the guide-rail block 303 is located at a side surface of the supporting portion 302 and fixedly connected with the supporting portion 302. In one embodiment, a side surface of the fixing bracket 300 is provided with a guide-rail groove 301, and the guide-rail groove 301 is open from a surface of the guide-rail block 303 facing away from the supporting portion 302.

Specifically, as shown in FIGS. 1 and 2, the lifting mechanism 400 is located below the cavity 100 and connected with the fixing bracket 300. The lifting mechanism 400 includes a lifting bracket 401, and the lifting bracket 401 is fixedly connected with the rotation mechanism 500 to drive the rotation mechanism 500 to move up or down.

As an example, as shown in FIGS. 1 and 2, the chemical vapor deposition device further includes one or more auxiliary brackets 600. Please refer to FIG. 6, which shows a schematic perspective view of the auxiliary bracket 600. The auxiliary bracket 600 includes a supporting rod 601, a sliding shaft 602 and a sliding member 603. A top end of the supporting rod 601 is fixedly connected with the bottom of the cavity 100. The supporting rod 601 includes a first extending side wing 601a and a second extending side wing 602b, which are arranged at intervals from bottom to top. A bottom end of the sliding shaft 602 is fixedly connected with the first extending side wing 601a, and a top end of the sliding shaft 602 is fixedly connected with the second extending side wing 601b. The sliding member 603 is connected with the lifting bracket 401 and sleeved on a periphery of the sliding shaft 602 and is configured to move up or down along the sliding shaft 602. In one embodiment, the lifting bracket 401 is provided with at least one perforation 401a allowing one or more sliding shafts 602 to pass through, respectively (see FIG. 7).

As an example, the chemical vapor deposition device has two auxiliary brackets 600, and the fixing bracket 300 and the two auxiliary brackets 600 are uniformly distributed around the base shaft 202, and form a stable triangular structure, thereby improving the supporting stability of the lifting bracket 401 to the rotation mechanism 500.

Figure 7:
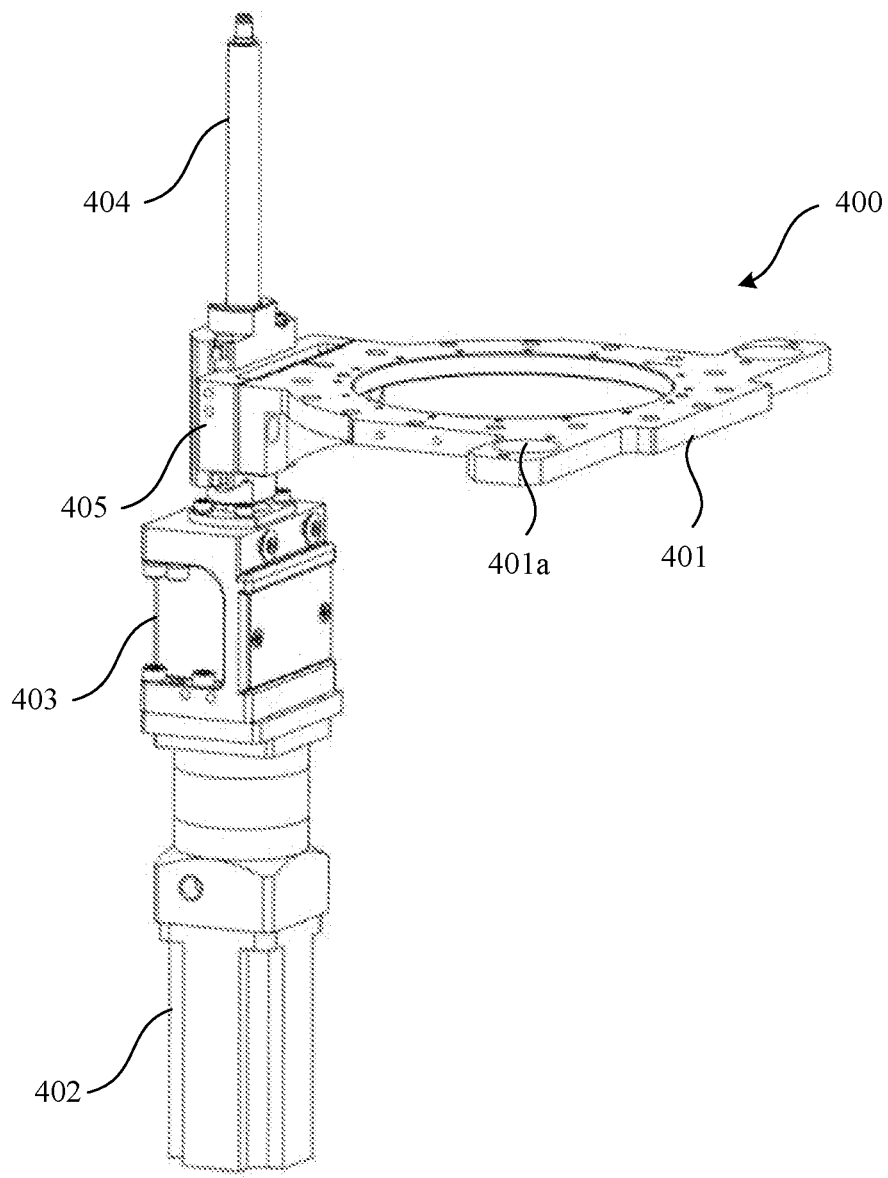
FIG. 7 shows a schematic perspective view of a lifting mechanism of the chemical vapor deposition device according to the present disclosure.

As an example, please refer to FIG. 7, which shows a schematic perspective view of the lifting mechanism 400. The lifting mechanism 400 further includes a driving motor 402, a reducer 403, a threaded rod 404 and a threaded block 405. The driving motor 402, the reducer 403 and the threaded rod 404 are sequentially connected from bottom to top.

Specifically, as shown in FIGS. 1, 2 and 7, the reducer 403 is fixedly connected with the fixing bracket 300, the threaded rod 404 is driven by the reducer 403 to rotate, and the threaded block 405 is sleeved on a periphery of the threaded rod 404 and is configured to move up or down along with the rotation of the threaded rod 404. A first side of the threaded block 405 is embedded into the guide-rail groove 301 of the fixing bracket 300 to enable the threaded block 405 to move up or down smoothly, and a second side of the threaded block 405 is fixedly connected with the lifting bracket 401 to drive the lifting bracket 401 to move up or down, thereby driving the rotation mechanism 500 to ascend and descend.

As an example, a top end of the reducer 403 is fixedly connected with a bottom end of the guide-rail block 303 of the fixing bracket 300, enabling a steady reduction in the speed of the driving motor 402. The driving motor 402 may be a servo motor.

Specifically, as shown in FIGS. 1 and 2, the rotation mechanism 500 is located below the cavity 100. Please refer to FIG. 8, which shows a schematic cross-sectional view of the rotation mechanism 500. The rotation mechanism 500 includes a stator 501, a rotor 502, a driven piece 503, a connector 504, a magnetic-liquid sealing member 505, a magnetic liquid 506, and a telescopic tubular assembly 507.

Figure 8:
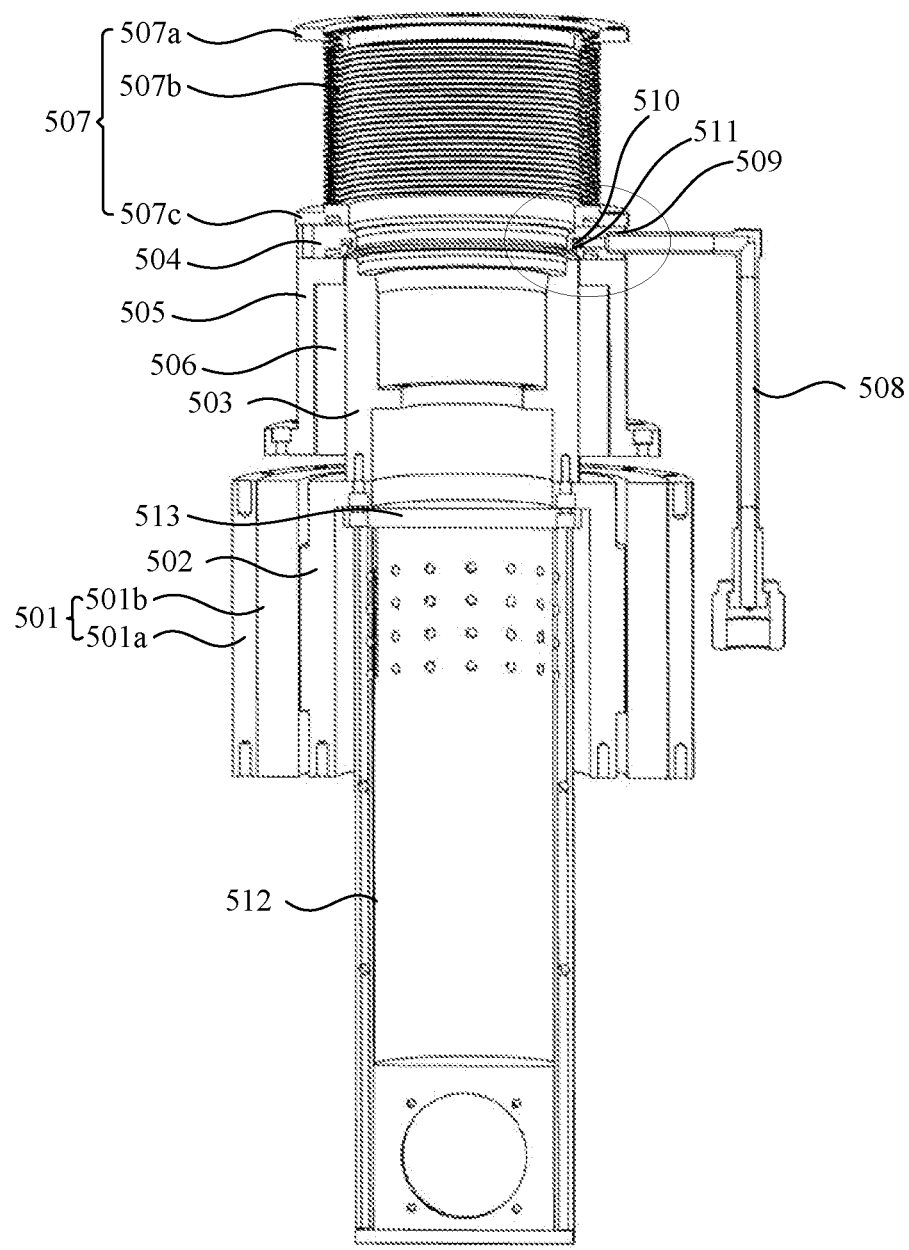
FIG. 8 shows a schematic cross-sectional view of a rotation mechanism of the chemical vapor deposition device according to the present disclosure.
Figure 9:
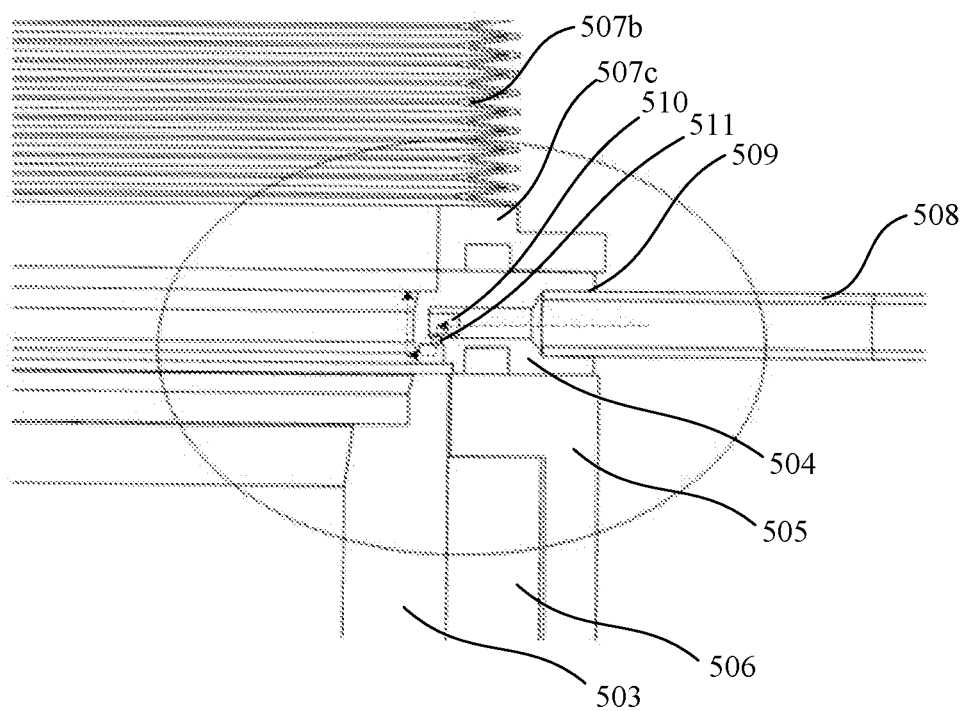
FIG. 9 shows an enlarged view of an elliptic area of FIG. 8.

Specifically, as shown in FIGS. 1, 2 and 8, the stator 501 is fixedly connected with the lifting bracket 401 and sleeved on a periphery of the rotor 502 to drive the rotor 502 to rotate with the base shaft 202 as a rotation axis. The driven piece 503 is located above the rotor 502 and fixedly connected with the rotor 502, the driven piece 503 is sleeved on a periphery of the base shaft 202 and fixedly connected with the base shaft 202, and the telescopic tubular assembly 507 is located above the driving member 503 and sleeved on the periphery of the base shaft 202. A top of the telescopic tubular assembly 507 is hermetically connected with the bottom of the cavity 100, and a bottom of the telescopic tubular assembly 507 is hermetically connected with a top of the connector 504. The magnetic-liquid sealing member 505 is sleeved on a periphery of the driven piece 503 and forms a magnetic-liquid containing space along with an outer-side wall of the driven piece 503. The magnetic liquid 506 is located in the magnetic-liquid containing space. A top of the magnetic-liquid sealing member 505 is hermetically connected with a bottom of the connector 504, and a bottom of the magnetic-liquid sealing member 505 is hermetically connected with a top of the lifting bracket 401.

As an example, a top of the stator 501 is fixedly connected with the lifting bracket 401.

As an example, the stator 501 includes a core 501a and a coil 501b, and the coil 501b is located between the core 501a and the rotor 502. The rotor 502 rotates with the base shaft 202 as a rotation axis under the influence of a magnetic field generated by the core 501a and the coil 501b. This rotation drives the driven piece 503 to rotate, which in turn rotates the base shaft 202.

As an example, the rotation mode of the rotor 502 is reciprocating rotation, so that the problem of physical entanglement and damage of electrical wires during the rotation process can be avoided.

As an example, the bottom of the connector 504 may be provided with a sliding groove (not shown), and a top end of the driven piece 503 may extend into the sliding groove and be slidably connected with the connector 504 to enhance the rotation stability of the driven piece 503.

Specifically, since the driven piece 503 needs to rotate, room for movement needs to be reserved between the top end of the driven piece 503 and the connector 504. In order to achieve sealing of the top area of the driven piece 503, the principle of magnetic-fluid sealing is utilized, that is, the magnetic-liquid sealing member 505 and the magnetic liquid 506 are used for sealing the top area.

It should be noted that physical vapor deposition (PVD) requires a very high pressure in the cavity and a very high sealing degree, which necessitates the use of a physical isolation seal to meet the conditions. One such method of sealing is magnetic coupling. The magnetic-liquid sealing of the present disclosure is different from the sealing principle driven by magnetic coupling. It can meet the sealing requirements of chemical vapor deposition (CVD) devices, which do not require too much high-vacuum sealing. Additionally, it simplifies transmission components, reducing instability and mechanical wear caused by redundant components. This results in higher accuracy and stability of lifting and rotation control, and lower manufacturing cost and power consumption.

Specifically, the magnetic liquid 506 is adsorbed onto an inner surface of the magnetic-liquid sealing member 505 and an outer surface of the driven piece 503. When the driven piece 503 rotates, the magnetic liquid still maintains the adsorbed state and isolates the internal space of the driven piece 503 from the outside.

As an example, the magnetic-liquid sealing member 505 is fixedly connected with the connector 504 via fasteners, and a sealing ring is provided between the top of the magnetic-liquid sealing member 505 and the bottom of the connector 504 to achieve sealing at the interface. The magnetic-liquid sealing member 505 is fixedly connected with the lifting bracket 401 via fasteners, and a sealing ring is provided between the bottom of the magnetic-liquid sealing member 505 and the top of the lifting bracket 401 to achieve sealing at the interface.

As an example, the telescopic tubular assembly 507 includes a first fixing member 507a, a corrugated pipe 507b and a second fixing member 507c. A top end of the corrugated pipe 507b is fixedly connected with the first fixing member 507a, a bottom end of the corrugated pipe 507b is fixedly connected with the second fixing member 507c, and the first fixing member 507a is hermetically connected with the bottom of the cavity 100.

As an example, the first fixing member 507a and the cavity 100 are fixed by fasteners, and a sealing ring is provided between a top surface of the first fixing member 507a and a bottom surface of the cavity 100 to achieve sealing at the interface.

As an example, as shown in FIG. 8, the rotation mechanism 500 further includes a blowing device 508, an outer-side surface of the connector 504 is provided with an air inlet 509 connected with the blowing device 508, an annular air channel 510 communicating with the air inlet 509 is embedded in the connector 504, and a plurality of air outlets 511 is formed in a bottom of the annular air channel 510. A vertical distance between the air outlets 511 and the base shaft 202 is smaller than a vertical distance between the outer-side wall of the driven piece 503 and the base shaft 202.

As an example, the plurality of air outlets 511 is uniformly distributed on the circumference of the annular air channel 510.

Specifically, the blowing device 508 continuously blows air into the interior of the connector 504 through a blowing pipe. Please refer to FIG. 9, which shows an enlarged view of an elliptic area of FIG. 8. The arrows indicate airflow. The airflow can prevent particles generated during chemical vapor deposition in the cavity 100 from falling into the magnetic liquid in the rotation mechanism 500, maintaining the sealing effect of the magnetic liquid.

As shown in FIGS. 1, 2 and 8, the rotation mechanism 500 further includes a filter 512 and an opening sealing member 513. A top end of the filter 512 extends into the rotor 502, a top of the opening sealing member 513 is connected with a top of the rotor 502 and covers a top opening of the rotor 502, and a bottom of the opening sealing member 513 is connected with a top of the filter 512 and covers a top opening of the filter 512. The opening sealing member 513 is provided with an electrical wire hole allowing at least one electrical wire to pass through, a first end of each electrical wire is connected with the base station 201, and a second end of the electrical wire passes through the electrical wire hole and extends to the outside through the filter 512.

Specifically, the filter 512 may filter electromagnetic waves transmitted from the base station 201 to the electrical wire, so as to avoid electromagnetic waves interfering with external power lines, thereby ensuring a stable power supply to the base station 201.

Specifically, the base station 201 performs reciprocating rotation, lifting movement, and wafer heating at the same time. Specifically, the lifting bracket 401 of the lifting mechanism 400 moves up and down along with the threaded block 405 and drives the rotation mechanism 500 to ascend and descend. The rotor 502 of the rotation mechanism 500 rotates with the base shaft 202 as a rotation axis while lifting, which drives the driven piece 503 to lift and rotate. Subsequently, the base shaft 202 and the base station 201 are brought into lifting and rotation movement in turn. In the rising process of the base shaft 202, the telescopic tubular assembly 507 is shortened, and in the descending process of the base shaft 202, the telescopic tubular assembly 507 extends. The electrical wires in the base shaft 202 power the heating of the base station 201, and the electrical wires perform reciprocating rotational motion along with the base station 201 without physical entanglement damage.

In summary, the present disclosure utilizes the principle of magnetic-fluid sealing to achieve device sealing and integrates the rotation and lifting functions. It can satisfy the coordinated work of reciprocating rotation, lifting movement, wafer heating, etc. at the same time without affecting each other. Moreover, by reciprocating rotation, it is also possible to avoid the problem of physical entanglement and damage of electrical wires during the rotation process. In addition, one blowing device can be set in the rotation mechanism to avoid the influence of micro-particles formed in the cavity on the rotation mechanism (or magnetic liquid), enabling the efficient and stable operation of the rotation mechanism. Compared to existing devices, the overall structure of the chemical vapor deposition device of the present disclosure has fewer transmission components, which reduces instability and mechanical wear caused by redundant components. This improves the accuracy and stability of lifting and rotation control, while also lowering manufacturing costs and power consumption. Therefore, the present disclosure effectively overcomes various shortcomings in the existing technology and has high industrial utilization value.

The above-mentioned embodiments are just for describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the scope of the present disclosure.

The invention claimed is:

1. A chemical vapor deposition device capable of reciprocating rotation and lifting, including:
   a cavity, provided with a through hole on a bottom of the cavity;
   a base, including a base station and a base shaft, wherein the base station is located in the cavity, the base shaft is located below the base station and fixedly connected with the base station, and a bottom end of the base shaft passes through the through hole to extend out of the cavity;

a fixing bracket, located below the cavity and fixedly connected with the bottom of the cavity;

a lifting mechanism, located below the cavity and connected with the fixing bracket, wherein the lifting mechanism includes a lifting bracket; and a rotation mechanism, configured to be located below the cavity and include a stator, a rotor, a driven piece, a connector, and a telescopic tubular assembly; wherein the stator is fixedly connected with the lifting bracket and sleeved on a periphery of the rotor to drive the rotor to rotate with the base shaft as a rotation axis; wherein the driven piece is located above the rotor and fixedly connected with the rotor, and the driven piece is sleeved on a periphery of the base shaft and fixedly connected with the base shaft; wherein the telescopic tubular assembly is located above the driven piece and sleeved on the periphery of the base shaft, a top of the telescopic tubular assembly is hermetically connected with the bottom of the cavity, and a bottom of the telescopic tubular assembly is hermetically connected with a top of the connector;

wherein the lifting mechanism further includes a driving motor, a reducer, a threaded rod and a threaded block; wherein the driving motor, the reducer and the threaded rod are sequentially connected from bottom to top; wherein the reducer is fixedly connected with the fixing bracket, the threaded rod is driven by the reducer to rotate, and the threaded block is sleeved on a periphery of the threaded rod and is configured to move up or down along with the rotation of the threaded rod; wherein a side surface of the fixing bracket is provided with a guide-rail groove, a first side of the threaded block is embedded into the guide-rail groove, and a second side of the threaded block is fixedly connected with the lifting bracket to drive the lifting bracket to move up or down;

wherein the fixing bracket includes a supporting portion and a guide-rail block; wherein a top end of the supporting portion is fixedly connected with the bottom of the cavity, and the guide-rail block is located at a side surface of the supporting portion and fixedly connected with the supporting portion; wherein a top end of the reducer is fixedly connected with a bottom end of the guide-rail block, and the guide-rail groove is open from a side of the guide-rail block away from the supporting portion.

2. The chemical vapor deposition device according to claim 1, wherein an outer-side surface of the connector is provided with an air inlet, an annular air channel communicating with the air inlet is embedded in the connector, and a plurality of air outlets is formed in a bottom of the annular air channel; wherein a vertical distance between the air outlets and the base shaft is smaller than a vertical distance between the outer-side wall of the driven piece and the base shaft.

3. The chemical vapor deposition device according to claim 1, wherein the bottom of the connector is provided with a sliding groove, and a top end of the driven piece extends into the sliding groove and is slidably connected with the connector.

4. The chemical vapor deposition device according to claim 1, wherein the rotation mechanism further includes a filter; wherein a top end of the filter extends into the rotor.

5. The chemical vapor deposition device according to claim 1, wherein the stator includes a core and a coil, and the coil is located between the core and the rotor.

6. The chemical vapor deposition device according to claim 1, wherein the chemical vapor deposition device further includes one or more auxiliary brackets, and each auxiliary bracket includes a supporting rod, a sliding shaft and a sliding member; wherein a top end of the supporting rod is fixedly connected with the bottom of the cavity, the supporting rod includes a first extending side wing and a second extending side wing which are arranged at intervals from bottom to top, a bottom end of the sliding shaft is fixedly connected with the first extending side wing, and a top end of the sliding shaft is fixedly connected with the second extending side wing; wherein the sliding member is a cylindrical, ring-shaped structure sleeved around the sliding shaft, configured to move up or down along the sliding shaft, and connected with the lifting bracket.

7. The chemical vapor deposition device according to claim 6, wherein the lifting bracket is provided with at least one perforation allowing the sliding shaft to pass through.

* * * * *